(12) United States Patent
Sun et al.

(10) Patent No.: US 10,334,754 B2
(45) Date of Patent: Jun. 25, 2019

(54) HEAT DISSIPATION DEVICE

(71) Applicant: AIC INC., Taoyuan (TW)

(72) Inventors: Kuo-Tsung Sun, Taoyuan (TW); Chung-I Kuo, Taoyuan (TW); Ta-Chih Chung, Taoyuan (TW)

(73) Assignee: AIC INC., Taoyuan (TW)

( * ) Notice: Subject to any disclaimer, the term of this patent is extended or adjusted under 35 U.S.C. 154(b) by 96 days.

(21) Appl. No.: 15/703,977

(22) Filed: Sep. 13, 2017

(65) Prior Publication Data

US 2019/0082558 A1 Mar. 14, 2019

(51) Int. Cl.
*H05K 7/20* (2006.01)
*G06F 1/20* (2006.01)

(52) U.S. Cl.
CPC ........... *H05K 7/20172* (2013.01); *G06F 1/20* (2013.01); *H05K 7/20136* (2013.01); *H05K 7/20145* (2013.01)

(58) Field of Classification Search
CPC ........... H05K 7/20136; H05K 7/20145; H05K 7/20154; H05K 7/20172; G06F 1/20
USPC .................. 361/679.48–679.49, 695
See application file for complete search history.

(56) References Cited

U.S. PATENT DOCUMENTS

| | | | |
|---|---|---|---|
| 5,186,605 A * | 2/1993 | Tracy | F04D 29/668 415/213.1 |
| 5,208,730 A * | 5/1993 | Tracy | F04D 29/668 361/679.48 |
| 6,373,698 B1 * | 4/2002 | Christensen | G06F 1/20 174/16.1 |
| 6,894,897 B1 * | 5/2005 | Nagurny | H05K 7/20172 165/122 |
| 8,944,760 B2 * | 2/2015 | Chiu | F04D 25/0613 361/679.48 |
| 2009/0310303 A1 * | 12/2009 | Najbert | F04D 29/601 361/695 |
| 2012/0121406 A1 * | 5/2012 | Wu | F04D 25/06 415/213.1 |
| 2012/0125565 A1 * | 5/2012 | Zhang | H05K 7/20172 165/67 |
| 2012/0318953 A1 * | 12/2012 | Tsai | H05K 7/20172 248/638 |
| 2013/0045108 A1 * | 2/2013 | Zhou | F04D 29/602 416/244 R |
| 2013/0202429 A1 * | 8/2013 | Kuo | H05K 7/20172 415/213.1 |
| 2015/0282384 A1 * | 10/2015 | Ho | H05K 7/20172 361/695 |

* cited by examiner

*Primary Examiner* — Jacob R Crum
(74) *Attorney, Agent, or Firm* — Chun-Ming Shih; HDLS IPR Services

(57) ABSTRACT

A heat dissipation device including a mounting seat, a fan hung on the mounting seat and a frame connected with the fan is provided. The fan has an air outlet and an air inlet opposite to the air outlet, the air inlet is disposed facing to the mounting seat, the frame is arranged surrounding the air inlet and clamped between the mounting seat and the air inlet. Thereby, a back flowing hot airflow is prevented from being sucked into the air inlet.

7 Claims, 5 Drawing Sheets

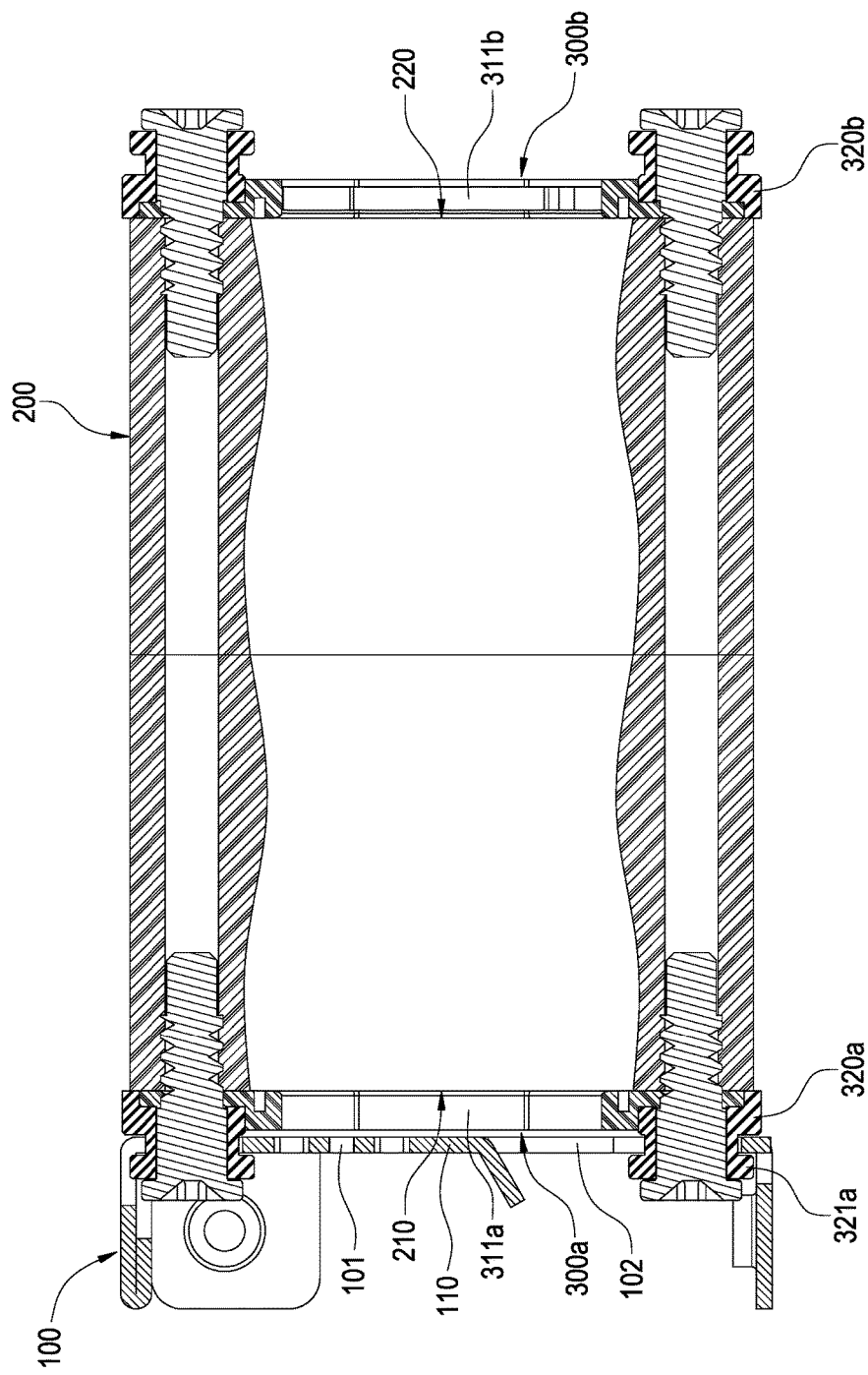

US 10,334,754 B2

HEAT DISSIPATION DEVICE

TECHNICAL FIELD

The present disclosure relates to a heat dissipation device of sever, in particular to an anti-backflow heat dissipation device.

BACKGROUND

In traditional, electrical devices such as a mother board and a power supply are arranged in a computer case. The electrical devices generate heat in operation, and multiple heat dissipation fans are commonly arranged in the computer case in order to ensure stability of the system. Generally, a fan supporter is arranged in the computer case and the heat dissipation fans are fixed to the fan supporter. The heat dissipation fans generate forced airflow and heat is thereby dissipated from the computer case.

In general, only a side of the fan mounted in the computer case is fixed with the fan supporter. A hot airflow blown from an air outlet of the fan is allowed to flow back to outside of an air inlet of the fan, because the air inlet of the fan is connected with the fan supporter and the air outlet is therefore hung. The air inlet is screwing connected with the fan supporter, and most of the back flowing hot air is blocked by the fan supporter and therefore cannot flow into the air inlet. However, a part of the hot air is re-sucked into the air inlet through a gap between the fan supporter and the fan. Accordingly, a heat dissipation performance of the fan is decreased by the back flowing hot air sucked thereinto. Increasing length of the fan to increase a distance between the air inlet and air outlet could reduce the back flowing hot air sucked thereinto. However, the hung end of the fan vibrates to impact adjacent portions of the computer case when in a high frequency rotation and noises therefore occur. The length of the fan is longer, the noises are more obvious.

In views of this, in order to solve the above disadvantage, the present inventor studied related technology and provided a reasonable and effective solution in the present disclosure.

SUMMARY

An anti-backflow heat dissipation device is provided in the present disclosure.

A heat dissipation device including a mounting seat, a fan hung on the mounting seat and a frame connected with the fan is provided in the present disclosure. The fan has an air outlet and an air inlet opposite to the air outlet, the air inlet is disposed facing to the mounting seat, the frame is arranged surrounding the air inlet and clamped between the mounting seat and the air inlet.

According to the heat dissipation device of the present disclosure, a set of fences is arranged on the mounting seat, and the set of fences covers the air outlet.

According to the heat dissipation device of the present disclosure, another frame is arranged on the air outlet, and a cushion is embedded in the frame arranged on the air outlet and protrudes from a periphery of the frame arranged on the air outlet. The frame arranged on the air outlet is arranged surrounding the air outlet. A set of fences is arranged on the frame arranged on the air outlet, and the set of fences covers the air outlet.

According to the heat dissipation device of the present disclosure, a latching slot is defined on the mounting seat, and a latch correspondingly snapped with the latching slot is arranged on the frame. A cushion is embedded in the frame and protrudes from a periphery of the frame. The latch is formed on the cushion.

According to the heat dissipation device of the present disclosure, a gap between the fan and the air inlet could be sealed by the frame clamped between the mounting seat and the air inlet of the fan, and a hot airflow flowing back from the air outlet is thereby prevented from being sucked into the air inlet. Moreover, according to the heat dissipation device of the present disclosure, the cushion arranged on the frame reduces noises by absorbing impactions between the fan in operation and adjacent objects.

BRIEF DESCRIPTION OF DRAWING

The present disclosure can be more fully understood by reading the following detailed description of the embodiment, with reference made to the accompanying drawings as follows:

FIGS. 1 to 5 are schematic views showing the heat dissipation device of the present disclosure.

DETAILED DESCRIPTION

Figure 1:
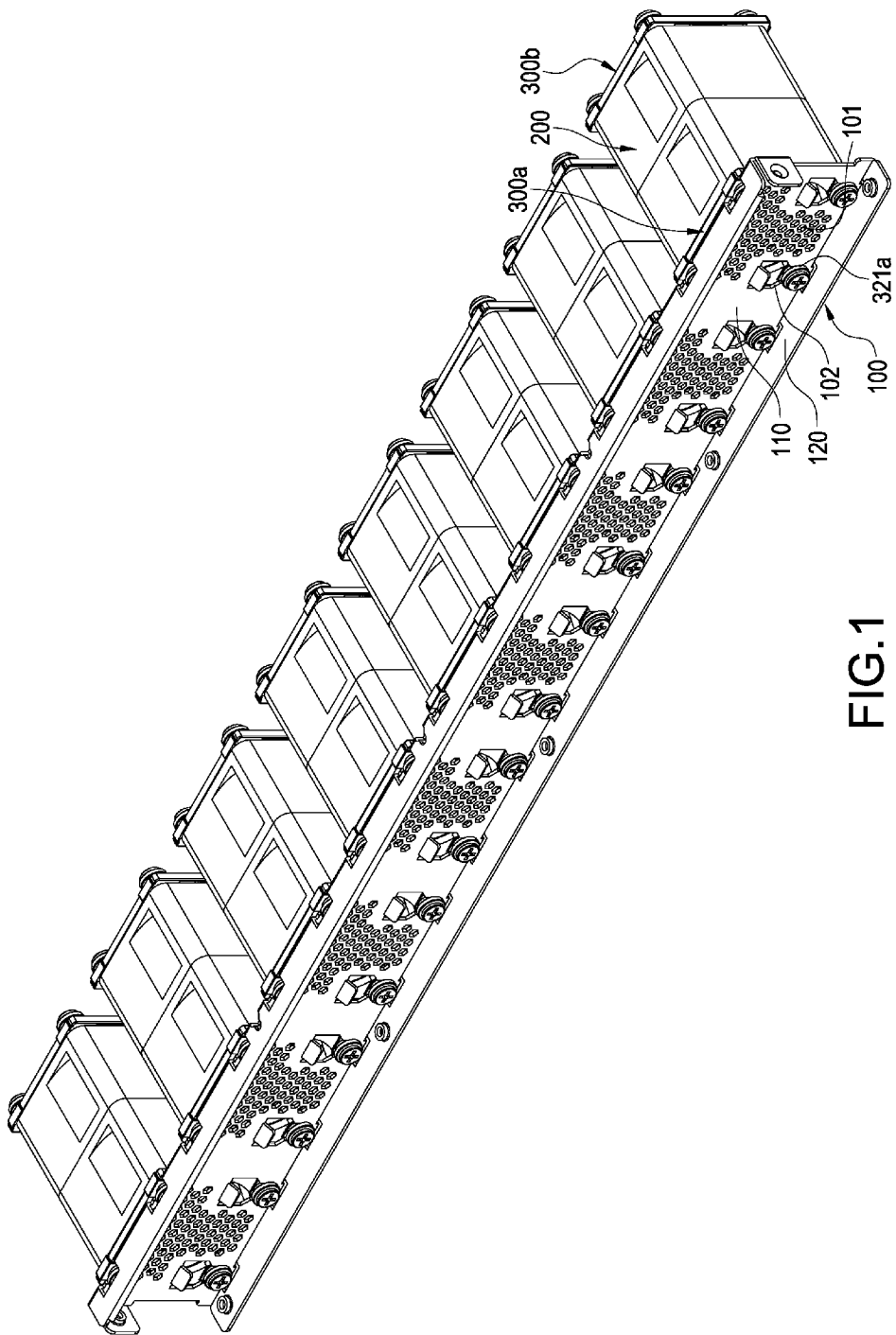
Figure 2:
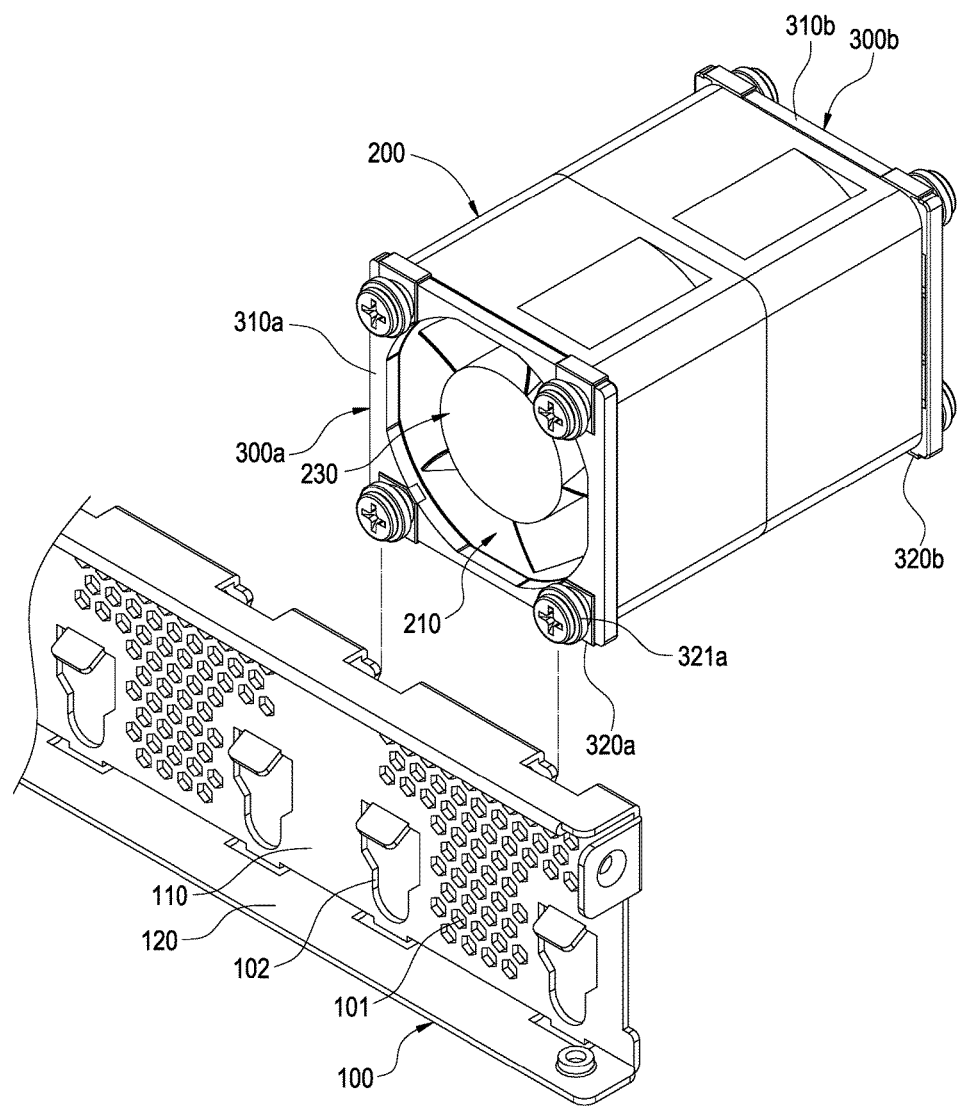
Figure 3:
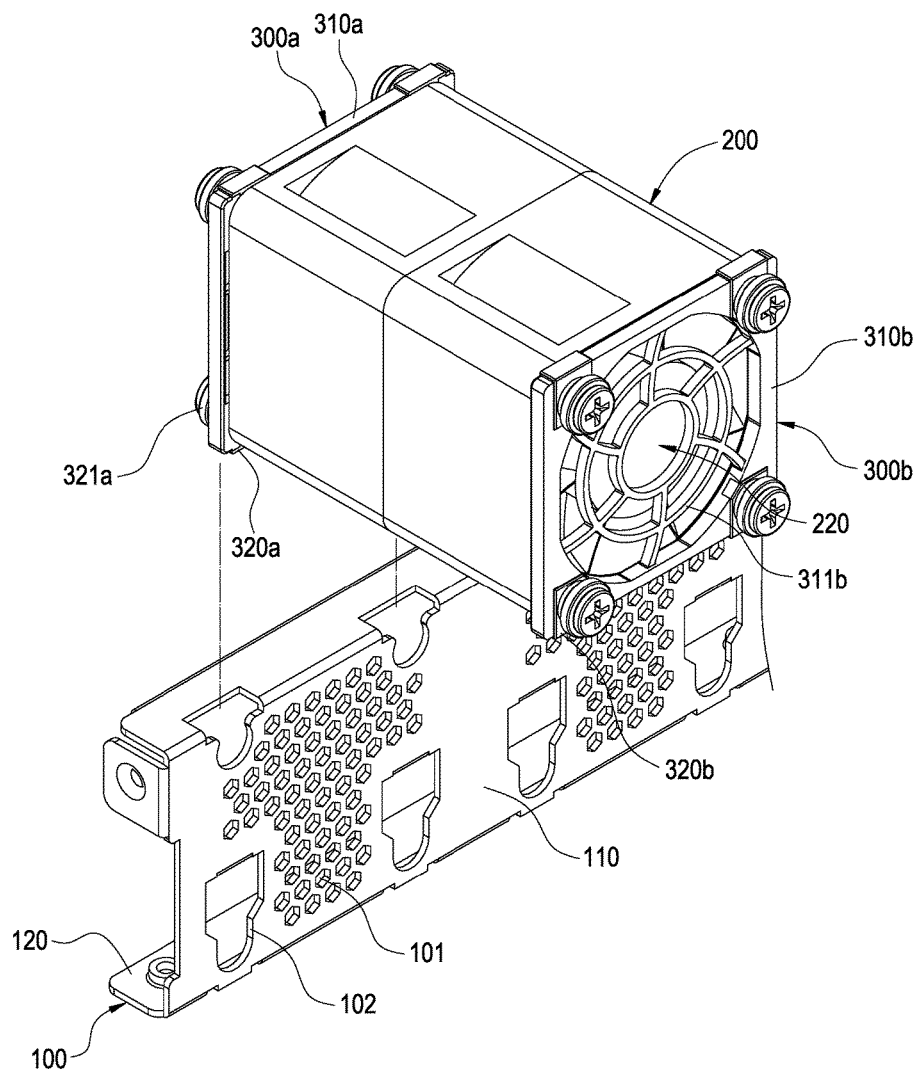
Figure 4:
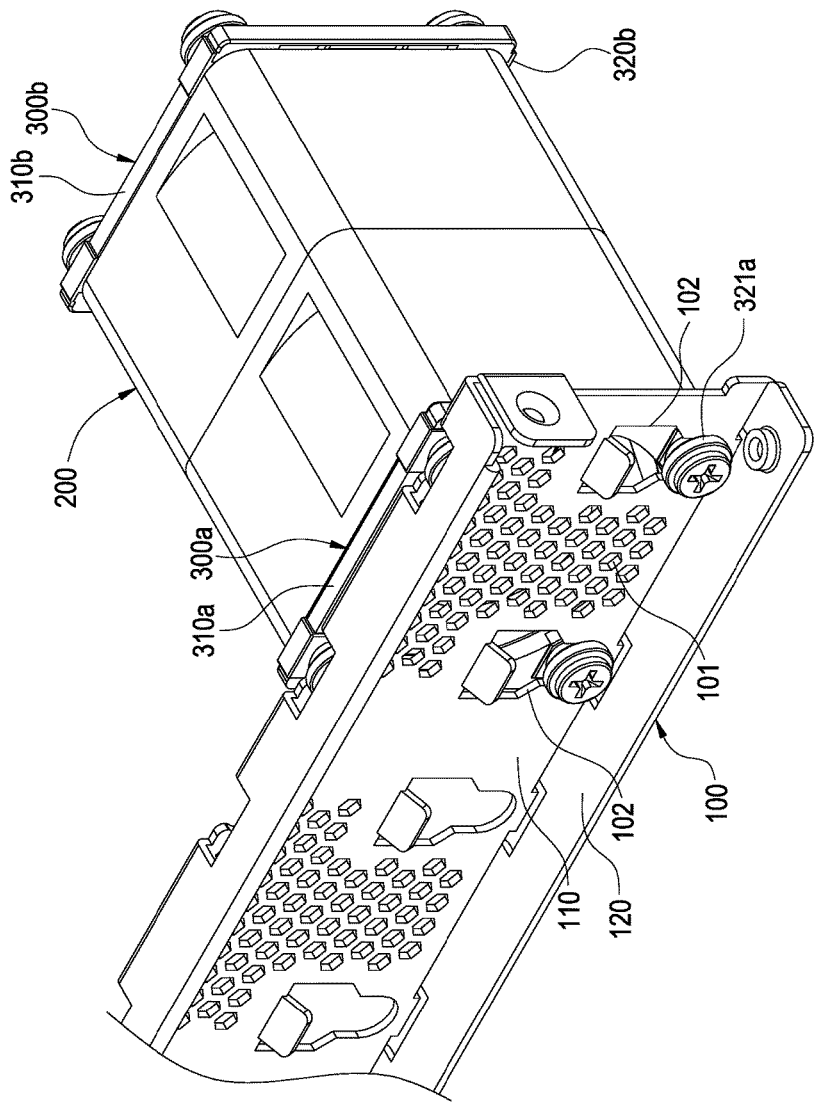

According to FIGS. 1 to 5, a heat dissipation device including a mounting seat 100, a fan 200 and at least a connecting supporter 300a/300b is provided in an embodiment of the present disclosure.

According to the present embodiment, the mounting seat 100 is a metal seat made by sheet metal process, the mounting seat 100 includes a perpendicular plate 110 a bottom plate 120 connected at a side of the perpendicular plate 110, and the perpendicular plate 110 and the bottom plate 120 are arranged perpendicular to each other. Multiple through holes are defined on the perpendicular plate 110 and arranged in a matrix, and a set of fences 101 is defined thereby. At least a latching slot 102 through the perpendicular plate 110 is defined on the perpendicular plate 110. The bottom plate 120 is used for connecting on an internal surface of a case (not shown in Figs.). Wherein, the case is preferably a case of a server, the mounting seat 100 is mounted on the case by connecting the bottom plate 120 with the case, and the perpendicular plate 110 is arranged perpendicular to the internal surface of the case and allows a fan 200 to be arranged thereon.

The fan 200 is hung on the mounting seat 100. Specifically, the fan 200 is hung on the perpendicular plate 110 of the mounting seat 100. According to the present embodiment, the fan 200 has an air inlet 210 and an air outlet 220, the air inlet 210 and the air outlet 220 are respectively arranged at two opposite sides of the fan 200, when the fan 200 is in operation, air is sucked into the fan 200 through the air inlet 210 and further blown out from the air outlet 220. The air inlet 210 is arranged facing to the perpendicular plate 110 of the mounting seat 100 and preferably screwing mounted on a surface of the perpendicular plate 110. Moreover, the set of fences 101 arranged on the mounting seat 100 covers the air inlet 210 to prevent the vanes 230 in the fan 200 from an accidental touch.

The connecting supporters 300a/300b are arranged on the fan 200, the connecting supporter 300a/300b arranged between the fan 200 and the hit objects could absorb impaction force while the running fan 200 vibrates to hit adjacent objects, and noises are thereby avoided. The connecting supporter 300a/300b could be arranged corresponding to the air inlet 210 or the air outlet 220, preferably, each of the air inlet 210 and the air outlet 220 is provided with connecting a supporter 300a/300b according to the present embodiment. However, the scope of the present disclosure should not be limited to the embodiment. Each connecting supporter 300a/300b includes a frame 310a/310b, and at least a cushion 320a/320b is arranged on each frame 310a/310b. The respective frames 310a/310b are connected with the fan 200, each cushion 320a/320b is embedded in the corresponding frame 310a/310b and arranged protruding from a periphery of the frame 310a/310b. According to the present embodiment, the respective frames 310a/310b are preferably made of plastic and thereby able to fix the cushions 320a/320b, and the respective cushions 320a/320b are made of soft rubber and thereby able to absorb shocks. The respective frames 310a/310b are embedded with the corresponding cushions 320a/320b by insert molding process.

The connecting supporter 300a arranged on the air inlet 210 is clamped between the mounting seat 100 and the fan 200, and this frame 310a is thereof arranged surrounding the air inlet 210. Thereby, a gap between the mounting seat 100 and the fan 200 could be sealed by this connecting supporter 300a. A latch 321a corresponding to the latching slot 102 on the mounting seat 100 is arranged on the connecting supporter 300a arranged on the air inlet 210, the latch 321a is used for snapping with the latching slot 102, and the fan 200 is thereby easy to be installed to the mounting seat 100. Moreover, the latch 321a is preferably formed on the cushion 320a and therefore could absorb shock as well, and shocks occurring on the mounting seat 100 caused by vibration of the running fan 200 are thereby avoided.

The frame 310b of the connecting supporter 300b arranged on the air outlet 220 is arranged surrounding the air outlet 220, and a set of fences 311b is arranged in this frame 310b. This set of fences 311b covers the air outlet 220 to block foreign objects sucked into the fan 200 through the air outlet 220. The fences 311b could be consist of multiple fences one-piece formed with the frame, and the fences 311b alternatively could be consist of metal wires arranged in the frame. However, the scope of the present disclosure should not be limited to the embodiment.

According to the heat dissipation device of the present disclosure, a gap between the fan 200 and the air inlet 210 is sealed by the frame 310a clamped between the mounting seat 100 and the air inlet 210 of the fan 200, and a hot airflow flowing back from the air outlet 220 is thereby prevented from being sucked into the air inlet 210. Furthermore, the cushions 320a/320b on the connecting supporters 300a/300b are able to absorb shocks, and noises caused by impaction between the running fan 200 and adjacent objects are thereby reduced.

Although the present disclosure has been described with reference to the foregoing preferred embodiment, it will be understood that the disclosure is not limited to the details thereof. Various equivalent variations and modifications can still occur to those skilled in this art in view of the teachings of the present disclosure. Thus, all such variations and equivalent modifications are also embraced within the scope of the present disclosure as defined in the appended claims.

What is claimed is:

1. A heat dissipation device, comprising:
   a mounting seat;
   a fan hung on the mounting seat; and
   a frame connected with the fan;
   wherein the fan has an air outlet and an air inlet opposite to the air outlet, the air inlet is disposed facing to the mounting seat, the frame is arranged surrounding the air inlet and clamped between the mounting seat and the air inlet;
   wherein a gap between the mounting seat and the air inlet is sealed by the frame clamped between the mounting seat and the air inlet of the fan, and a hot airflow flowing back from the air outlet is thereby prevented from being sucked into the air inlet; and
   wherein a latching slot is defined on the mounting seat, a latch is arranged on the frame, wherein the latch is hollow with an axial through-hole extending entirely through the latch, an end of the latch is inserted entirely through the frame to directly contact the fan, the other end of the latch is correspondingly snapped with the latching slot and thereby the fan is hung on the mounting seat.

2. The heat dissipation device according to claim 1, wherein a set of fences is arranged on the mounting seat, and the set of fences covers the air inlet.

3. The heat dissipation device according to claim 1, wherein another frame is arranged on the air outlet, and a cushion is embedded in the frame arranged on the air outlet and protrudes from a periphery of the frame arranged on the air outlet.

4. The heat dissipation device according to claim 3, wherein the frame arranged on the air outlet is arranged surrounding the air outlet.

5. The heat dissipation device according to claim 4, wherein a set of fences is arranged on the frame arranged on the air outlet, and the set of fences covers the air outlet.

6. The heat dissipation device according to claim 1, wherein a cushion is embedded in the frame and protrudes from a periphery of the frame.

7. The heat dissipation device according to claim 6, wherein the latch is formed on the cushion.

\* \* \* \* \*